(12) United States Patent
Ding

(10) Patent No.: US 6,306,720 B1
(45) Date of Patent: Oct. 23, 2001

(54) METHOD FOR FORMING CAPACITOR OF MIXED-MODE DEVICE

(75) Inventor: Yen-Lin Ding, Hsinchu (TW)

(73) Assignee: United Microelectronics Corp., Hsinchu (TW)

(*) Notice: Subject to any disclaimer, the term of this patent is extended or adjusted under 35 U.S.C. 154(b) by 0 days.

(21) Appl. No.: 09/492,563

(22) Filed: Jan. 27, 2000

(30) Foreign Application Priority Data

Jan. 10, 2000 (TW) .............................................. 891002660

(51) Int. Cl.[7] .............................. H01L 21/20; H01L 21/76
(52) U.S. Cl. ............................. 438/391; 438/386; 438/387
(58) Field of Search ..................................... 438/386, 387, 438/391

(56) References Cited

U.S. PATENT DOCUMENTS 6,093,600 * 7/2000 Chen et al. ........................... 438/243
6,159,874 * 12/2000 Tews et al. ........................... 438/964

* cited by examiner

*Primary Examiner*—Charles Bowers
*Assistant Examiner*—William M. Brewster

(57) ABSTRACT

A method of forming a capacitor of a mixed-mode device is described. Trenches used for forming a trench-type capacitor are simultaneously formed in a provided substrate while forming a shallow trench isolation. A conductive region used as a lower electrode is formed by ion implantation. A gate oxide layer, used for dielectric film, and a polysilicon layer, used as a gate and an upper electrode, are formed over the substrate and over the trenches. A trench-type capacitor is thus formed.

8 Claims, 3 Drawing Sheets

US 6,306,720 B1

METHOD FOR FORMING CAPACITOR OF MIXED-MODE DEVICE

CROSS-REFERENCE TO RELATED APPLICATION

This application claims the priority benefit of Taiwan application Ser. No. 89100260, filed Jan. 10, 2000.

BACKGROUND OF THE INVENTION

1. Field of the Invention

The invention relates in general to a method for forming a capacitor, and more particularly to a method for forming a capacitor of a mixed-mode device.

2. Description of the Related Art

Recently, applications for semiconductor devices have become wider and wider. For example, computers, communication produces, and consumer electronics produces comprise semiconductor devices, which have different functions. Semiconductor devices fabricated for different requirements are called application specific integrated circuits (ASIC).

Furthermore, with the progress in semiconductor process technologies, necessary capital expenditure is rapidly decreasing. Applications in electronic devices have been developed toward variety so that devices with a single function such as logic devices no longer satisfy requirements. Therefore, semiconductor processes are gradually developed toward integrating a logical device and a memory device on the same wafer, which structure is called a system on chip (SOC). A mixed-mode device comprising a capacitor and a complementary metal oxide semiconductor (CMOS) is one kind of ASIC.

FIG. 1 is a diagram showing a conventional capacitor structure of a mixed-mode device. Referring to FIG. 1, the conventional capacitor structure comprises a N-type conductive region 102 formed in a substrate 100, a polysilicon layer 104 and a gate oxide layer 106. N-type conductive region 102 is formed by doping N-type impurities into substrate 100, polysilicon layer 104, which is doped with an N-type dopant, serves as electrodes, and gate oxide layer 106 serves as a dielectric film. Conductive regions 102a are formed at two sides of the conductive region 102 in the substrate 100. The conductive regions 102a are used to electrically connect to an external power source. The doped polysilicon layer 104 is simultaneously formed while forming a gate on the gate oxide layer 106.

The conventional capacitor is a planar capacitor. The amount of charge stored in the conventional capacitor does not satisfy the high-capacitance requirement.

SUMMARY OF THE INVENTION

The invention provides a method for forming a capacitor of a mixed-mode device that satisfies the high-capacitance requirement. A substrate is provided. A pad oxide layer and a first mask layer are formed on the substrate. A first shallow trench and second shallow trenches are formed in the substrate by photolithography and etching processes. The first shallow trench is used to isolate active regions from each other. The second shallow trenches are used to form capacitors. A liner oxide layer is formed on an exposed surface of the substrate within the first shallow trench and the second shallow trenches. A dielectric layer is formed over the substrate and within the trenches. A portion of the dielectric layer on the first mask layer is etched to expose the first mask layer. The first mask layer and the pad oxide layer are removed. A second mask layer is provided over the substrate, by which the first shallow trench is covered and the second shallow trenches are exposed. The liner oxide layer and the dielectric layer within the second shallow trenches are removed. A first ion implantation process is performed to form a first conductive region in the substrate around the second shallow trenches. The second mask layer is removed. A gate oxide layer is formed on the substrate. A conductive layer is formed to fill in and over the second shallow trenches. A second ion implantation process is performed to form a second conductive region in the substrate around the conductive layer. The second conductive region electrically connects to the first conductive region. The second conductive region is also used to connect to an external power.

In the invention, the second shallow trenches, which are used to increase the surface area of a capacitor, and the first shallow trench, which is used for isolation, are simultaneously formed. The first conductive region in the substrate around the second shallow trenches is used as a lower electrode. The conductive layer over the gate oxide layer is used as an upper electrode. The gate oxide layer is used as a dielectric film between the lower and the upper electrodes. A trench-type capacitor is thus formed.

Fabrication of the trench-type capacitor can be integrated into a fabrication of CMOS so that the whole process is easily performed.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

FIGS. 2A to 2E are schematic, cross-sectional views showing the process steps of one preferred embodiment of the method for forming a capacitor of a mixed-mode device.

Figure 2A:
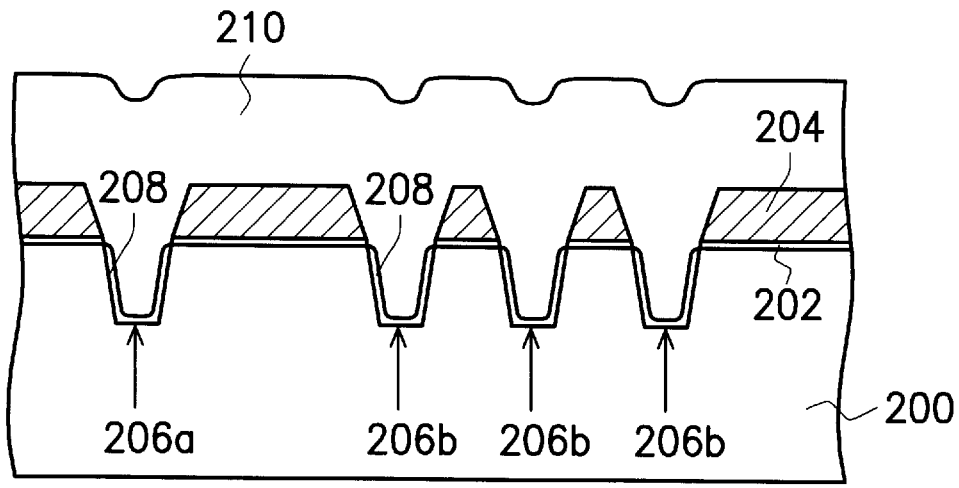
FIGS. 2A to 2E are schematic cross-sectional views showing the process steps of one preferred embodiment of the method for forming a capacitor of a mixed-mode device.

In FIG. 2A, a pad oxide layer 202 and a mask layer 204 are formed on a provided substrate 200. A photolithography and etching process is performed to form trenches 206a and 206b in the substrate 200. The trench 206a is used to isolate active areas (active regions) from each other. The trenches 206b are used for forming a trench-type capacitor.

For example, the pad oxide layer 202 with a thickness of about 100–300 Å is formed by thermal oxidation. The mask layer 204, such as a silicon nitride layer, is formed by chemical vapor deposition (CVD) and has a thickness of about 1500–2000 Å. Each of the trenches 206a, 206b is about 3000–5000 Å deep.

Furthermore, a liner oxide layer 208 is formed on the substrate 200 exposed within the trenches 206a, 206b. The liner oxide layer 208 is formed by, for example, thermal oxidation. A thickness of the liner oxide layer 208 is about 100–250 Å. A dielectric layer 210, such as silicon nitride, is formed to cover the layer 204 and to fill the trenches 206a, 206b. The dielectric layer 210 is formed by, for example, CVD.

Figure 2B:
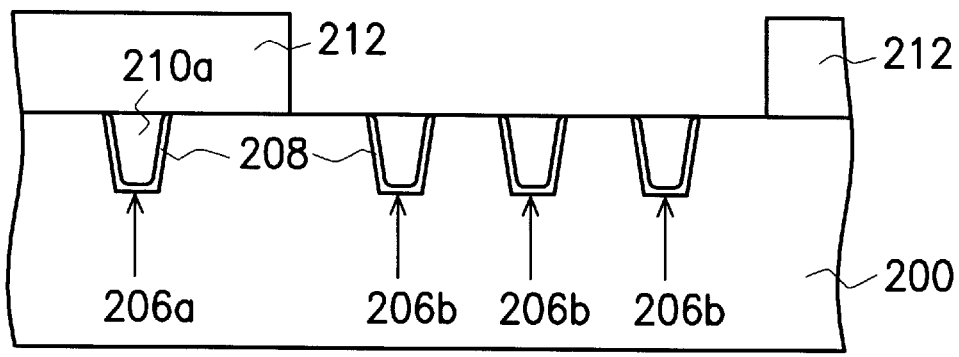

In FIG. 2B, a planarization process is performed on the dielectric layer 210 to remove a portion of the dielectric layer 210 on the mask layer 204 until the mask layer 204 is exposed. The mask layer 204 is used as a stop layer while performing the planarization process. After performing the planarization process, the mask layer 204 and the pad oxide layer 202 are removed by, for example, wet etching. The dielectric layer 210a remains within the trenches 206a, 206b. A mask layer 212, such as photoresist, is formed over the substrate 200 to cover the trench 206a, which is used for isolation. Trenches 206b are exposed by the mask layer 212.

Figure 2C:
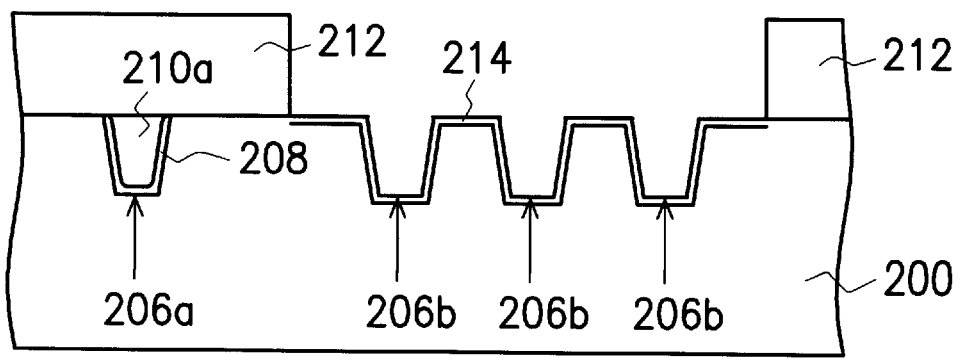

In FIG. 2C, the dielectric layer 210a and the liner oxide layer 208 within the exposed trenches 206b are removed by, for example, wet etching. A conductive region 214 is formed in the substrate 200 around the trenches 206b. The conductive region 214 is formed by an ion implantation process. $N^+$-type ions are implanted into the substrate 200 to form the conductive region 214.

Figure 2D:
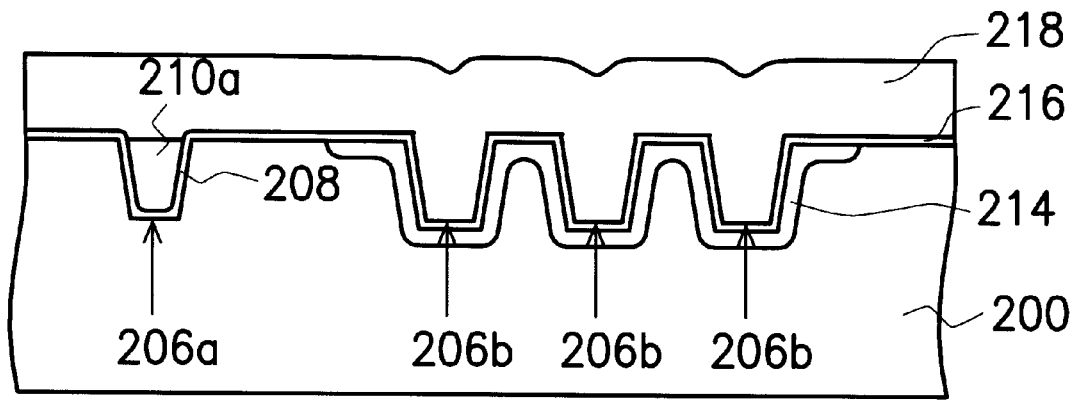

In FIG. 2D, the mask layer 212 is removed. Then, a gate oxide layer 216 is formed over the substrate 200. The gate oxide layer 216 is formed by, for example, thermal oxidation. A conductive layer 218 is formed on the gate oxide layer 216 and to fill the shallow trench 206b. The conductive layer 218 is, for example, a doped polysilicon layer formed by CVD. Additionally, several steps, such as forming a sacrificial oxide layer, wells, or a channel region, for forming a CMOS are performed after removing the mask layer 212 and before forming the gate oxide layer 216. However, these steps are conventional and detailed description is therefore omitted.

Figure 2E:
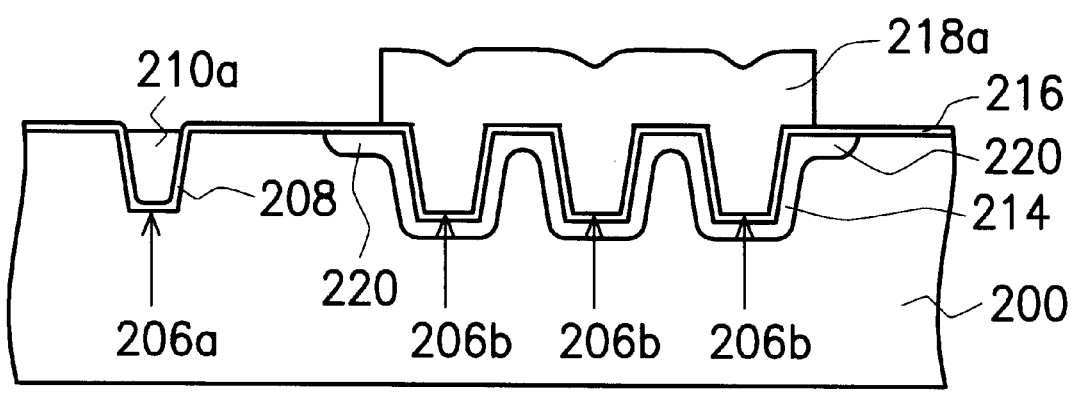

In FIG. 2E, the conductive layer 218 is patterned to leave a part of the conductive layer, denoted as 218a, positioned on the shallow trenched 206b. An ion implantation process is performed to form a conductive region 220 in the substrate and around the conductive layer 218a. The conductive region 220, which is electrically connected to the conductive region 214, is used to connect to an external power source.

The conductive layer 218 is used as an upper electrode of a trench-type capacitor. The conductive region is used as a lower electrode of the capacitor, and the gate oxide layer 216 is used as a dielectric film of the capacitor. Fabrication of the trench-type capacitor is integrated into the CMOS fabrication process. The conductive layer 218 is used as a gate of a CMOS, and the conductive region 220 in the substrate 200 is formed while forming source/drain regions of the CMOS.

Figure 1:
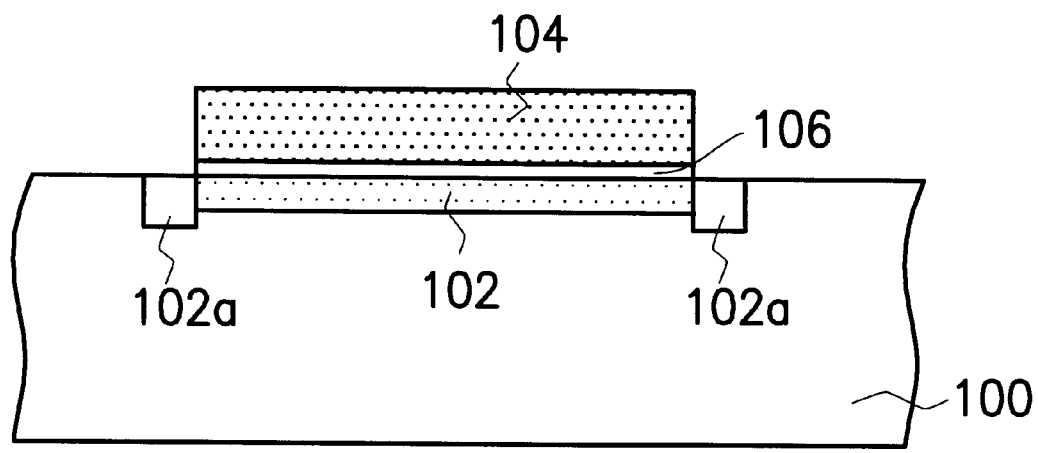
FIG. 1 is a schematic cross-sectional diagram showing a conventional capacitor structure of a mixed-mode device.
Figure 3:
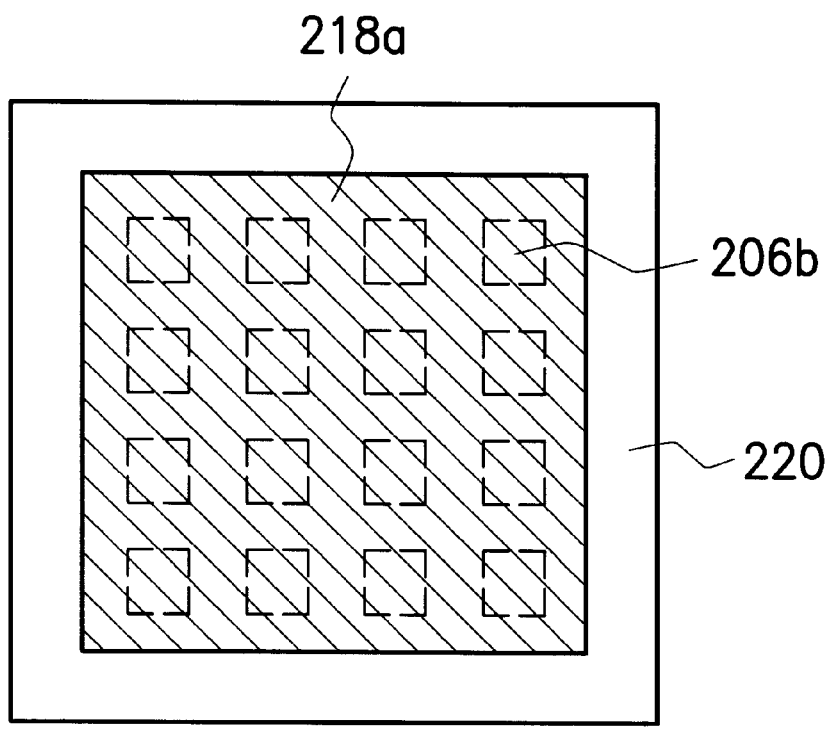
FIG. 3 is a schematic top view showing the capacitor structure of the mixed-mode device.

FIG. 3 is a top view showing the capacitor structure of the mixed-mode device. Referring to FIG. 3, positions of the shallow trenches 206b are located in a matrix. Each of the shallow trenches 206b is square in shape. Length and width of each square is about 0.4 um. However, the shallow trenches 206b can have other, such as circular, shapes.

For example, when a conventional planar capacitor having a surface area of 100 $um^2$ is provided, 100 $um^2$ of a substrate must be required for forming the planar capacitor. However, the structure of the shallow trenches of the invention can provide more surface area than a planar structure. If there are 16 trenches located in a matrix and each of the trenches has a depth of 0.4 um, only 45 $um^2$ of the substrate is required for forming these trenches for a trench-type capacitor. Thus, the structure of the invention can be used to enable device size reduction.

One feature of the invention is that trenches used for forming a trench-type capacitor and shallow trench isolation are simultaneously formed. A conductive region used as a lower electrode is formed by ion implantation. A gate oxide layer, used for dielectric film, and a polysilicon layer, used as a gate and an upper electrode, are formed over the substrate and over the trenches. A trench-type capacitor is thus formed. The steps for formation of the trench-type capacitor are integrated into the MOS fabrication; thus, the process complexity of the invention does not increase beyond that of the prior art.

Another feature of the invention is that the disclosed method is able to form a trench-type capacitor having a capacitance equal to that of a conventional planar capacitor, but in a surface area smaller than that required by the conventional planar capacitor.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for forming a capacitor of a mixed-mode device, comprising the steps of:

providing a substrate;

forming a first trench in a first area and a plurality of second trenches different from the first area in the substrate, wherein the first trench is used for isolation and the second trenches are used to form a capacitor;

forming a liner oxide layer on the substrate exposed within the first trench and the second trenches;

forming a dielectric layer to fill the first trench and the second trenches;

forming a mask layer over the substrate and the first trench, wherein the second trenches are exposed by the mask layer;

removing the liner oxide layer and the dielectric layer exposed by the mask layer;

performing a first ion implantation to form a first conductive region in the substrate around the second trenches;

removing the mask layer;

forming a gate oxide layer over the substrate;

forming a conductive layer over and filling the second trenches; and performing a second ion implantation to form a second conductive region in the substrate around the conductive layer, wherein the second conductive region electrically connects to the first conductive region and an external power source.

2. The method according to claim 1, wherein the step of forming the first trench and the second trenches comprises the steps of:

forming a pad oxide layer on the substrate;

forming a silicon nitride layer on the pad oxide layer; and performing a photolithography and etching process to form the first trench and the second trenches in the substrate.

3. The method according to claim 1, wherein a material of the mask layer comprises photoresist.

4. The method according to claim 1, wherein a material of the conductive layer comprises polysilicon, which is doped with impurities.

5. A method for forming a capacitor of a mixed-mode device, comprising the steps of:

providing a substrate having a first trench in a first area and a plurality of second trenches different from the first area therein, wherein the plurality of second trenches are used to form a trench-type capacitor;

forming a liner oxide layer and a dielectric layer to fill the first trench and to form a shallow trench isolation structure;

forming a first conductive region in the substrate around the second trenches;

forming a gate oxide layer on the exposed substrate within the second trenches;

forming a conductive layer over the second trenches, whereby the trench-type capacitor is formed; and forming a second conductive region in the substrate beside the first conductive region.

6. The method according to claim 5, wherein the conductive layer comprises a doped polysilicon layer.

7. The method according to claim 5, wherein the first conductive region is formed by performing an ion implantation process.

8. The method according to claim 5, wherein the second conductive region is formed by performing an ion implantation process.

* * * * *